United States Patent [19]

Takeuchi

[11] Patent Number: 5,970,351

[45] Date of Patent: Oct. 19, 1999

[54] PRODUCTION METHOD FOR A MISFET, COMPLEMENTARY MISFET

[75] Inventor: Kiyoshi Takeuchi, Tokyo, Japan

[73] Assignee: NEC Corporation, Tokyo, Japan

[21] Appl. No.: 08/890,826

[22] Filed: Jul. 10, 1997

Related U.S. Application Data

[62] Division of application No. 08/540,911, Oct. 11, 1995.

[30] Foreign Application Priority Data

Oct. 12, 1994 [JP] Japan .................................. 6-246454
Aug. 30, 1995 [JP] Japan .................................. 7-221739

[51] Int. Cl.$^6$ .................................................. H01L 21/336
[52] U.S. Cl. ........................... 438/300; 438/301; 438/231
[58] Field of Search .................................. 438/300, 301, 438/199, 230, 231, 232

[56] References Cited

U.S. PATENT DOCUMENTS

| | | | |
|---|---|---|---|
| 5,023,676 | 6/1991 | Tatsuta .................................... | 257/280 |
| 5,079,180 | 1/1992 | Rodder et al. ......................... | 438/297 |
| 5,124,276 | 6/1992 | Samata et al. ......................... | 438/607 |
| 5,168,072 | 12/1992 | Molslehi ................................ | 438/300 |

OTHER PUBLICATIONS

H. Shibata et al., "High Performance Half–Micron PMOSFETs with 0.1 μm Shallow P$^+$N Junction Utilizing Selective Silicon Growth and Rapid Thermal Annealing," 1987 IEEE, IEDM 87, pp. 590–593.

C. Mazuré et al., "Facet Engineered Elevated Source/Drain by Selective Si Epitaxy for 0.35 Micron MOSFETs," 1992 IEEE, IEDM 92, pp. 853–856.

K. Goto et al., "A Novel Fabrication Method for Short Channel MOSFETs Using Self–Aligned Ultrashallow Junction Formation by Selective $Si_{1-x}Ge_x$ CVD," *Extended Abstracts of the 1994 International Conference on Solid State Devices and Materials*, Yokohama, 1994, pp. 999–1000.

*Primary Examiner*—John F. Niebling
*Assistant Examiner*—John Murphy
*Attorney, Agent, or Firm*—Sughrue, Mion, Zinn, Macpeak & Seas, PLLC

[57] ABSTRACT

A method of producing a transistor having a source and drain diffusion layer formed so that is has a junction of a shallow depth and is low in parasitic resistance and parasitic capacitance. The method allows the manufacture of a transistor having a gate insulator formed on a principal plane of a semiconductor substrate, a gate electrode formed on the gate insulator, and source and drain diffusion layers of one conductivity type formed on the principal plane of the semiconductor substrate across the gate electrode. A semiconductor thin film layer doped with an impurity of the same conductivity type is selectively deposited on the principal plane of the semiconductor substrate on which the source and drain diffusion layers are formed. A facet face is formed at an end portion of the semiconductor thin film which opposes to a sidewall of the gate electrode. The facet face has an inclination angle between a sidewall face of the gate electrode and the principal plane of the semiconductor substrate.

20 Claims, 11 Drawing Sheets

PRODUCTION METHOD FOR A MISFET, COMPLEMENTARY MISFET

This is a divisional of application Ser. No. 08/540,911 filed Oct. 11, 1995.

BACKGROUND OF THE INVENTION

1. Field of the Invention

This invention relates to a semiconductor device, and more particularly to a structure of and a method of producing an MISFET.

2. Description of the Related Art

In an MISFET and a method of producing it, in order to reduce the gate length of the MISFET while suppressing a short channel effect (a phenomenon where, as the gate length becomes short, the threshold voltage drops or the device is prevented from entering a non-conducting condition), the depth of the source and drain region should be reduced substantially in proportion to the gate length.

Normally, a source and drain region of an MISFET is formed by implanting an impurity into a substrate by ion implantation and then heating the substrate to electrically activate the impurity (so that the impurity enters into site positions of the substrate crystal). In this instance, in order to make the thickness of a diffusion layer of the source and drain region shallow, either the energy of ion implantation is reduced to reduce the implantation range of the ions or the annealing time is reduced, or the processing temperature is lowered to suppress diffusion of the impurity. With the ion implantation described above, however, a channeling phenomenon occurs wherein the impurity profile trails the end in the depthwise direction toward a particular crystal orientation in which the collision probability with atoms of the substrate is low. Particularly, this phenomenon occurs remarkably with atoms having a small mass number such as boron atoms. Further, for electric activation of the impurity, unrestricted reduction of the annealing time or unrestricted lowering of the processing temperature is not an option. For these reasons, realization of a shallow junction required by submicron devices is increasingly difficult.

Further, even if a shallow junction is realized with an MISFET, the MISFET still has a problem of the parasitic resistance. In particular, as the reduction of the MISFET proceeds, the resistance of the channel portion of the MISFET device decreases. Conversely, the parasitic resistance of the source and drain region tends to increase because the depth thereof decreases. Therefore, although the performance of the intrinsic device is improved, the performance of the entire device is suppressed by the parasitic resistance, and this greatly reduces the advantage of size reduction very much.

Figure 1A:
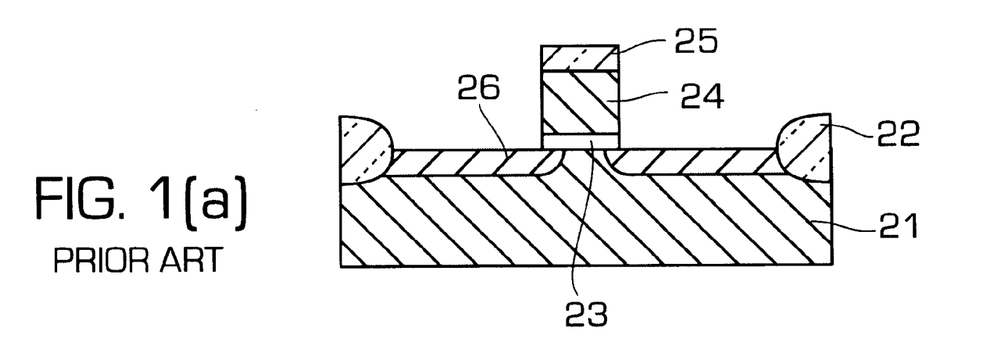
FIGS. 1(a) to 1(c) are sectional views illustrating successive steps of a conventional method of producing an MISFET.
Figure 1B:
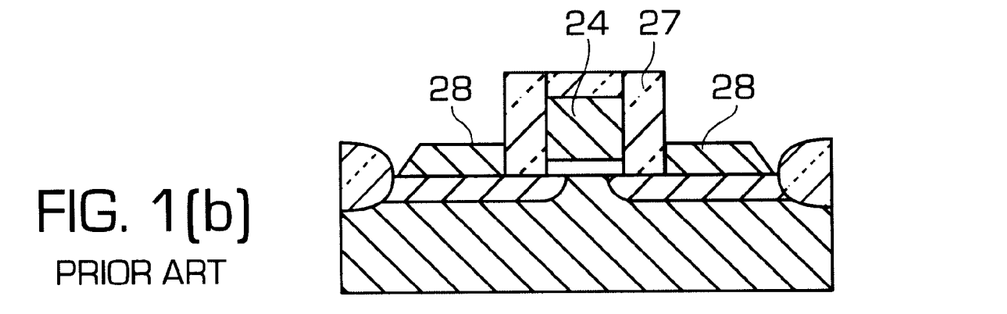
Figure 1C:
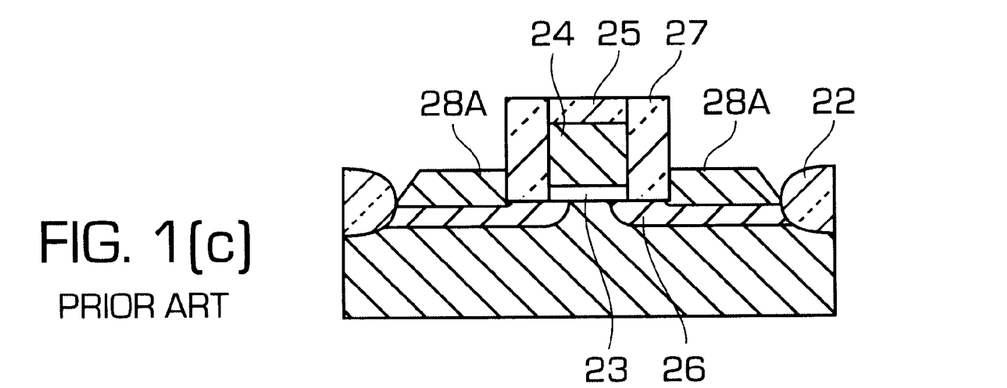

Thus, in order to realize a reduced MISFET, it is required that the source and drain diffusion layer be formed with a small depth and a low resistance. As a means of achieving this, a device structure wherein the source and drain region is elevated with respect to the substrate has conventionally been examined. A method of producing such a structure is disclosed in IEDM Technical Digest, 1987, pp. 590–593. FIGS. 1(a) to 1(c) are sectional views illustrating successive steps of the method of producing a reduced p-channel MOSFET disclosed in this paper. The prior art disclosed in the paper is hereinafter referred to as the first prior art.

Referring to FIG. 1(a), isolation 22 is first formed on the surface of silicon substrate 21, and then gate insulator 23 and gate electrode 24 are successively formed. Further, cap insulator 25 is formed on gate electrode 24. Thereafter, low concentration diffusion layer 26 is formed. Here, the formation of low concentration diffusion layer 26 is performed by ion implantation of boron, and the impurity concentration is adjusted to approximately $10^{18}$ atoms/cm$^3$.

Then, sidewall insulator 27 for covering a sidewall of gate electrode 24 is formed as shown in FIG. 1(b). The film thickness of sidewall insulator 27 is approximately 100 nm. Thereafter, elevated source and drain 28 is formed on low concentration diffusion layer 26 described above. This elevated source and drain 28 is formed by selective growth of a silicon single crystal. Then, an impurity of boron is implanted into the selectively formed elevated source and drain 28, and then annealing for activation is performed. In this instance, for the ion implantation, a method wherein boron is implanted, so that the end of the implanted boron region may reach the inside of the semiconductor substrate, or another method, wherein boron is implanted so that almost all of it is contained in, elevated source and drain 28 and is then diffused into the substrate by subsequent annealing, may be available. However, since the diffusion increases the end trailing phenomenon of the impurity profile compared with that in its initial condition, the former method is preferably employed for the production method.

A p-channel MOSFET having elevated source and drain diffusion layer 28A as shown in FIG. 1(c) is formed in such a manner as described above. Here, the diffusion layer of the source and drain region of the MOSFET has a structure (hereinafter referred to as LDD structure) which has a region of a low impurity concentration (normally called lightly doped drain region) and another region of a high impurity concentration.

Figure 2A:
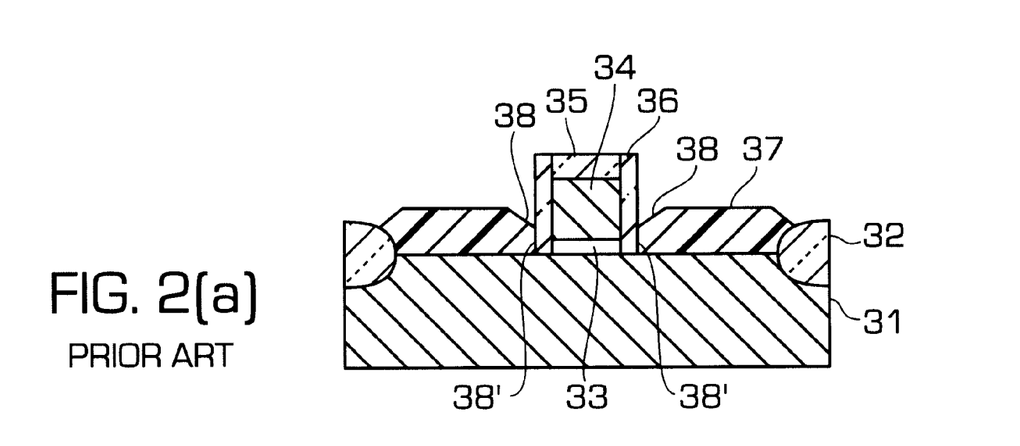
FIGS. 2(a) and 2(b) are sectional views illustrating successive steps of another conventional method of producing an MISFET.
Figure 2B:
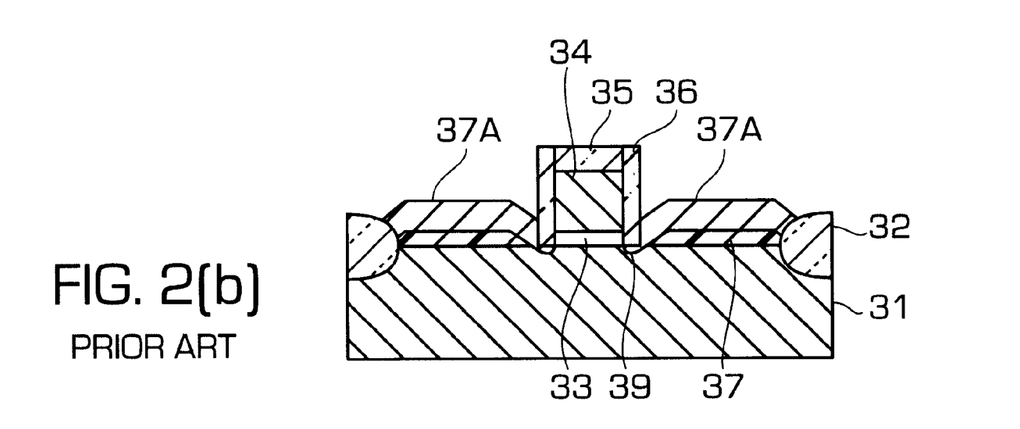

A method of forming a source and drain region different from the first prior art described above is disclosed in IEDM Technical Digest, 1992, pp. 853–856. FIGS. 2(a) and 2(b) are sectional views illustrating successive steps of the method of producing a reduced n-channel MOSFET disclosed in the paper just mentioned. This prior art is hereinafter referred to as the second prior art.

Referring to FIG. 2(a), isolation 32 is first formed on the surface of silicon substrate 31 and then gate insulator 33, gate electrode 34, cap insulator 35 and sidewall insulator 36 are successively formed. Thereafter, elevated source and drain 37 is formed. Here, elevated source and drain 37 is formed by selective growth of a silicon single crystal. Further, facet 38 is formed at a location where elevated source and drain 37 contacts with sidewall insulator 36, and a lower face 38' closely contacts with the gate sidewall insulator.

Then, ion implantation of phosphor into elevated source and drain 37 is performed, and then annealing is performed. Source and drain diffusion layer 37A is formed in this manner on elevated source and drain 37 as shown in FIG. 2(b), and source and drain junction surface 39 is formed in a portion of silicon substrate 31.

Differences of the second prior art from the first prior art will be described below except for the difference in conductive type. In particular, the first difference is that the diffusion layer of the source and drain does not have the LDD structure. Instead, however, the thickness of sidewall insulator 36 is reduced to several tens of nanometers so that phosphor implanted into elevated source and drain 37 by ion implantation may reach a location below gate electrode 34 by the ion implantation and thermal diffusion. The second difference is in that facet 38 (a surface which appears during epitaxial growth and is directed in a particular crystal orientation) is formed at a portion of elevated source and drain 37 formed by the selective growth at which elevated source and drain 37 contacts with sidewall insulator 36. Due to the presence of facet 38, an increase of the parasitic capacitance between gate electrode 34 and source and drain diffusion layer 37A, when the sidewall insulator is formed thin, is suppressed.

Figure 3A:
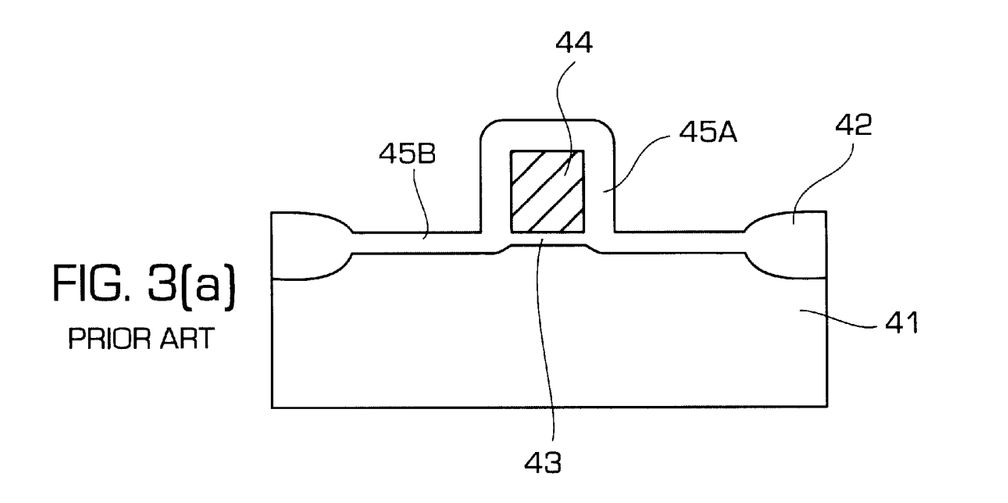
FIGS. 3(a) and 3(b) are sectional views illustrating successive steps of a further conventional method of producing an MISFET.
Figure 3B:
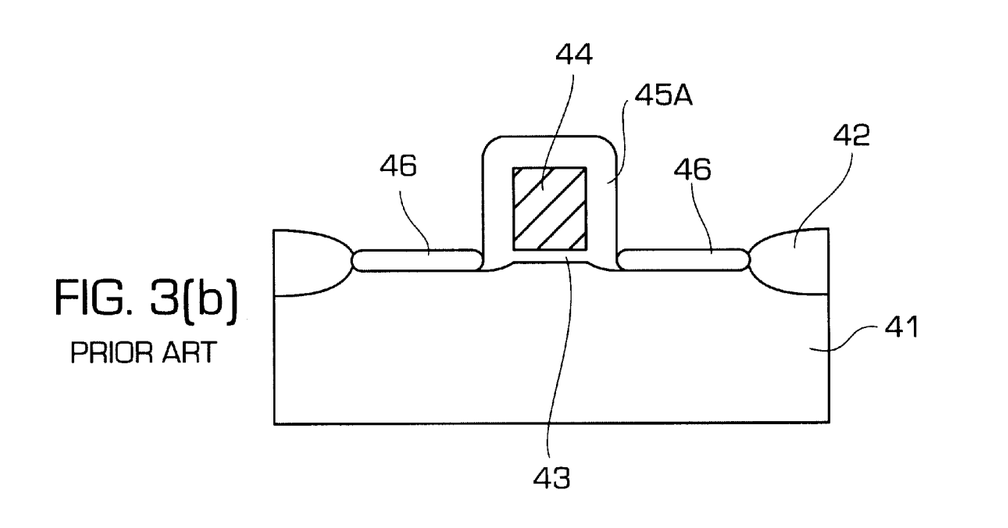

Meanwhile, an MISFET, which employs a semiconductor selectively grown in order to obtain a junction surface of a shallow depth, and a method of producing the same are reported in SSDM Extended Abstracts, 1994, pp. 999–1000. The prior art disclosed in the paper just mentioned is hereinafter referred to as third prior art. As seen in FIG. 3(a), isolation 42 is first formed on the surface of silicon substrate 41 and then gate insulator 43 and gate electrode 44 are successively formed of polysilicon. Thereafter, thermal oxides 45A and 45B are formed on the surfaces of silicon substrate 41 and gate electrode 44 by thermal oxidation. In this instance, since the rate of oxidation is different between substrate 41 and gate electrode 44, thermal oxide 45A of a greater thickness is formed on gate electrode 44. Thereafter, oxide films 45 are etched by isotropic etching, and only silicon substrate 41 is exposed while thicker thermal oxide 45A remains around gate electrode 44. Then, single crystal 46 of p-type silicon-germanium mixed crystal doped with boron is selectively grown only on the exposed surface of silicon substrate 41. By the steps described above, such a p-type MOSFET as shown in FIG. 3(b) is formed.

The first and second prior arts have a basic idea that, where the extent of the impurity after completion of the ion implantation step and the annealing step is represented by depth a and the thickness of the elevated source and drain is represented by b, b is subtracted from a to decrease the depth of the junction from the surface of the semiconductor substrate and the thickness of the source and drain region is maintained by the elevated source and drain to reduce the parasitic resistance. However, the method wherein the junction depth is determined by subtraction involves a great error of the junction depth. For example, where a=100 nm, b=50 nm and the relative error for both a and b is ±10%, the junction depth is a−b=50 nm and the maximum error of the junction depth is 100 nm×0.1 +50 nm×0.1=15 nm, and consequently, the relative error of the junction depth (=15 nm/50 nm) amounts to ±30%. It is difficult to control the dispersion in relative error of the junction depth.

Further, the first and second prior arts have a common disadvantage in that, since ion implantation is employed, the concentration of the source and drain diffusion layer in the inside of the substrate cannot be raised sufficiently due to an influence of the trailing of the end of the impurity profile described above. Where the impurity concentration is represented by N and the depth is represented by x, the following equation (1) given below stands approximately at the end portion:

$$d(\log_{10}N)/dx=C \qquad (1)$$

Here, if concentration N at junction depth $x=x_j$ from the surface of the semiconductor surface is placed as $N_j$, then concentration $N_s$ at the surface of the substrate (at the lower surface of the elevated source and drain) is approximately given by the equation (2):

$$N_s=N_j\times 10^{cx_j} \qquad (2)$$

where C is a constant.

In ion implantation, the trailed end is great, or in other words, C is small. Consequently, $N_s$ does not become sufficiently high, and the resistance of a portion of the source and drain region, which is positioned below the surface of the substrate, does not exhibit a sufficiently reduced value. In the elevation structure, the resistance of the source and drain layer below the sidewall, above which there is no elevated layer, has a comparatively high rate. Therefore, reduction of the resistance of the portion of the source and drain region in the substrate is important.

The first prior art has a drawback in that the short channel effect and the magnitude of the parasitic resistance almost depend upon the structure of the LDD portion. Since the LDD portion is produced by an ordinary production method, the depth of the LDD portion cannot be reduced very much, and if only the source and drain diffusion layer of a high concentration is formed shallow, the improvement in short channel effect will be slight. Further, since the parasitic resistance of the LDD portion of a low concentration has a significant impact on the parasitic resistance of the source and drain region, the resistance reduction effect by the elevation is also small. Accordingly, the characteristic of the MISFET device exhibits little or no improvement from that of a device having an ordinary LDD structure.

The second prior art has a drawback in that, since the sidewall insulator of the gate electrode has a reduced thickness, the parasitic capacitance between the gate electrode and the source and drain region is large. In order to suppress the parasitic capacitance, a facet is utilized in the second prior art. However, the capacitance reduction effect is restricted because, in order to achieve the effect of reduction of the junction depth while ion implantation is employed, a portion (38' in FIG. 2) at which the sidewall insulator of the gate electrode and the elevated source and drain closely contact with each other must be provided. Further, in this instance, since a region which is not doped with the impurity is produced at a portion of the elevated source and drain, the resistance reduction effect is reduced.

On the other hand, with the third prior art, since ion implantation is not employed and a source and drain diffusion layer is formed by selective growth of crystal doped in advance, a junction of a shallow depth can be produced with a high degree of controllability. However, if the thickness of the selective growth layer is set to such a low value (as recited in the document, e.g. 15 nm) that the parasitic capacitance does not matter, an increase in resistance that arises from the fact that the junction depth is shallow is not suppressed sufficiently. On the contrary, if the thickness of the selective growth layer is increased, a decrease in resistance by elevation of the source and drain can be anticipated. In this instance, however, the parasitic capacitance creates a problem more serious than those of the two foregoing prior arts. In the third prior art which makes use of solid phase diffusion, the extent of the impurity in a lateral direction is small, and the distance between the selective growth layer and the gate must be set much closer (approximately 10 nm) than those in the two foregoing prior arts so that the impurity of the source and drain may reach a location below the gate. Otherwise, the driving capacity of the MISFET device is damaged remarkably. As a result, the parasitic capacitance between the diffusion source and the gate is greatly increased, and the speed of operation of the circuitry is decreased. The production method of the third prior art has another drawback in that it is difficult to form a complementary construction, that is, to integrate both n-type and p-type MISFETs on a single substrate. Where ion implantation is employed as in the prior arts 1 and 2, a complementary MOSFET can be formed readily by covering, upon ion implantation into the source and drain of one conductivity type, the region of the other conductivity type with a photoresist. However, in the third method wherein a diffusion layer doped in advance is formed, such a simple method as used in the first and second prior arts cannot be employed.

SUMMARY OF THE INVENTION

It is an object of the present invention to provide an MISFET which, solving the problems described above, includes a source and drain diffusion layer having a shallow junction depth and having a low parasitic resistance and a low parasitic capacitance and being suitable for reduction.

In order to attain the object described above, according to an aspect of the present invention, there is provided an MISFET, comprising a gate insulator formed on a principal plane of a semiconductor substrate, a gate electrode formed on the gate insulator, and two source and drain diffusion layers of one conductivity type formed on the principal plane of the semiconductor substrate across the gate electrode, The structure includes a semiconductor thin film layer, which is doped with an impurity of the same conductivity type being selectively deposited on the principal plane of the semiconductor substrate, on which the source and drain diffusion layers are formed, and a facet face formed at an end portion of the semiconductor thin film which opposes to a sidewall of the gate electrode, the facet face having an inclination angle between a sidewall face of the gate electrode and the principal plane of the semiconductor substrate. Meanwhile, in a complementary MISFET, the configuration described above is formed in either the n-type MISFET or the p-type MISFET.

Preferably, the semiconductor thin film layer is a thin film having the same crystal structure as silicon, such as silicon single crystal, germanium, or mixed crystal of silicon and germanium. The perfered MISFET is formed such that the principal plane of the semiconductor substrate is a {100} plane, the facet face is a {311} plane or a {111} plane, and a channel widthwise direction of the gate electrode is a <011> direction.

A method of producing an MISFET of the present invention comprises the steps of forming a gate electrode on a gate insulator on a principal plane of a semiconductor substrate, then forming a first insulator on a sidewall face of the gate electrode, and then selectively growing a semiconductor thin film layer containing an impurity of one conductivity type in a region of the principal plane of the semiconductor substrate to form a source and drain diffusion layer. The method of producing an MISFET may also include a subsequent step of diffusing the impurity of the one conductive type from the semiconductor thin film layer into the semiconductor substrate by thermal diffusion.

Here, in the selective growth of the semiconductor thin film layer, the facet face having the inclination angle between the sidewall face of the gate electrode and the principal plane of the semiconductor substrate is formed at an end portion of the semiconductor thin film layer which opposes to the sidewall of the gate electrode.

The method of producing an MISFET may further comprise, after the semiconductor thin film layer is selectively grown, the step of forming a second insulator covering the first insulator formed on the sidewall face of the gate electrode, and the step of implanting ions of an impurity of the one conductivity type into or through the semiconductor thin film layer to dope the impurity of the one conductive type into the source and drain and dope the impurity also into the gate electrode.

The method of producing an MISFET may further comprise, after the gate insulators and the gate electrodes of the complementary transistor are formed on the semiconductor substrate, the step of covering the entire area of the semiconductor substrate with an insulator, and the step of performing anisotropic dry etching of the insulator, leaving the insulator in a region in which one of the transistors of one conductivity type is to be formed and on the sidewall faces of the gate electrode for the other conductivity type transistors. The method of producing an MISFET may further comprise, after the anisotropic dry etching, the step of selectively growing a semiconductor thin film layer and then selectively removing the insulator. Furthermore, the method of producing an MISFET may further comprise the step of thereafter removing the insulator selectively and covering the entire area with an insulator and repeating a set of steps similar to those described above for inter-changing the conductivity type.

Since doping of an impurity is performed while selective growth is performed simultaneously upon formation of an elevated source and drain, the impurity is doped uniformly in a high concentration compared with that obtained when an impurity is doped by a conventional ion implantation method. Consequently, the resistance of the elevated source and drain is reduced compared with that of the prior arts. Further, immediately after the growth, the concentration gradient between the elevated source and drain and the substrate is a very steep staircase-like gradient. Since doping of the impurity into the substrate is based on solid phase diffusion starting from this condition, a steeper profile can be obtained compared with that obtained using ion implantation, and if the junction depth is equal, the resistance of the source and drain diffusion layer in the inside of the substrate also becomes lower than that obtained using ion implantation. The junction depth depends only on the diffusion amount and is easy to control, and the problem of dispersion in junction depth caused by the conventional elevation method does not occur. From the necessity for the impurity to reach the location below the gate electrode, the sidewall insulator of the gate electrode is formed thin, and consequently, the elevated source and drain has a low resistance approaching the gate electrode, effectively reducing the parasitic resistance. Further, since ion implantation is not used, the entire side face of the elevated source and drain which opposes the sidewall of the gate electrode can be formed as a facet, and the parasitic capacitance can be suppressed to the minimum.

It is to be noted, upon production of a complementary MISFET, an elevated source and drain of a desired conductive type is formed only in a desired region on the substrate by performing selective growth of an elevated source and drain of one conductive type after a region which is to have the other conductive type is covered with an insulator.

DESCRIPTION OF THE PREFERRED EMBODIMENT

Figure 4A:
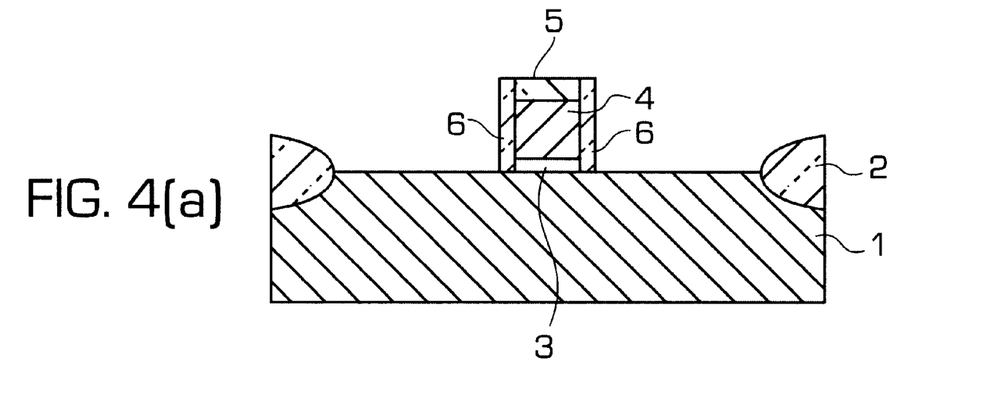
FIGS. 4(a) to 4(c) are sectional views illustrating successive steps of a first embodiment of the present invention.
Figure 4B:
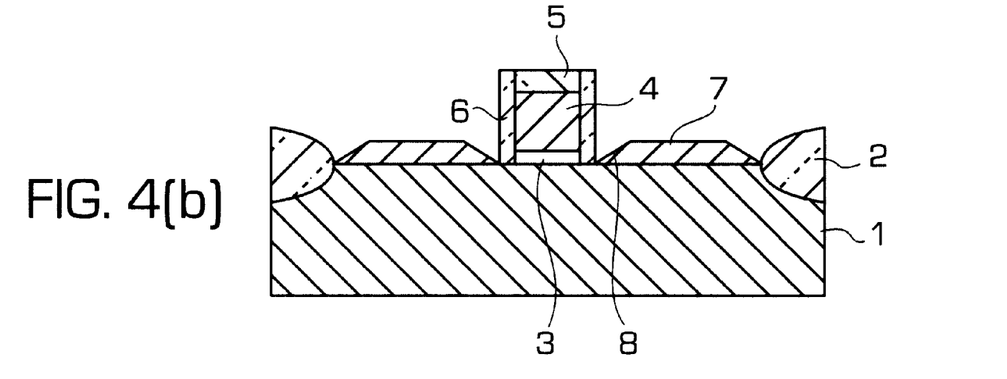
Figure 4C:
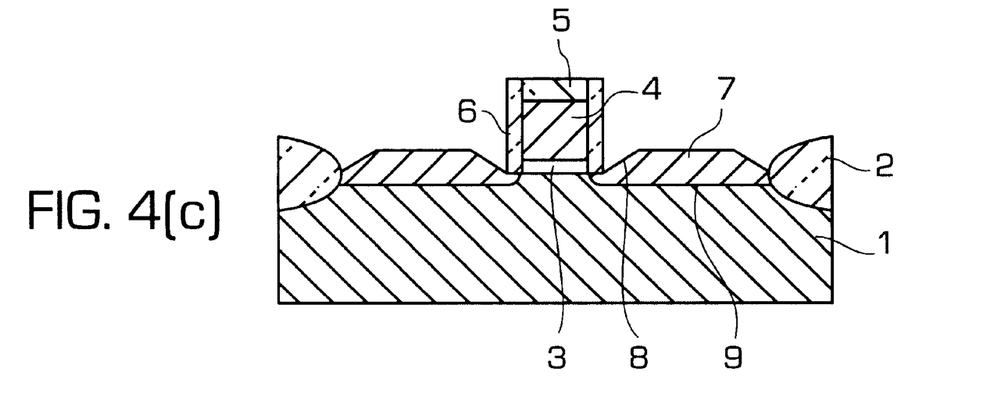

The present invention will be described below with reference to the drawings. FIGS. 4(a) to 4(c) are sectional views illustrating successive steps of a method of production of an MISFET of the first embodiment of the present invention. It is to be noted that the structure of the present invention is described in the description of the method of production.

In the production method of an MISFET of the present invention, as shown in FIG. 4(a), isolation 2 is formed on silicon substrate 1 doped with an n-type impurity and having a crystal plane orientation of (100), and then gate insulator 3 is formed. Then, a gate electrode material and an insulator are deposited, and gate electrode 4 and cap insulator 5 are formed by etching.

In the etching, gate electrode 4 and cap insulator 5 are patterned so that the direction of the channel width of the gate electrode, that is, the direction perpendicular to the section shown in FIG. 4(a), may be <011> or a direction near to <011>. Here, the <011> direction is a direction equivalent to [011]. In the method of production, an insulator is subsequently deposited again over the entire surface of the substrate using a CVD method or some other suitable method, and then etching back is performed to form sidewall insulator 6 of approximately 3 to 50 nm thick on a side face of gate electrode 4 and to expose the surface of the substrate on which a source and drain diffusion layer is to be formed. Here, for the material of the gate electrode, a polysilicon, a metal, a compound of a metal and silicon (metal silicide), or a member including two or more layers of the materials is suitably selected and used. For cap insulator 5 and sidewall insulator 6, a silicon nitride film or a silicon oxide film is used. Then, a silicon single crystal thin film doped with boron to the order of $10^{19}$ to $10^{20}$ atoms/cm$^3$ is selectively grown only at the exposed portion of the surface of the substrate to form elevated source and drain 7 (FIG. 4(b)). The growth is performed at a temperature as low as possible (for example, 600° C.), so that boron is not diffused into the substrate during the growth making the transition of the concentration at the boundary between elevated source and drain 7 and the silicon substrate steep like a staircase. Further, the fact that the growth rate on the {311} plane or the {111} plane of the silicon single crystal is low is made use of so that facet 8 of the {311} plane or {111} plane may be produced at a portion of the silicon single crystal at which it contacts with sidewall insulator 6. In this instance, although the side face of elevated source and drain 7 may closely contact with sidewall insulator 6, this is not advantageous since this increases the parasitic capacitance. In the present embodiment, facet 8 is formed so that the elevated source and drain do not closely contact with the sidewall insulator.

Here, if the gate electrode is formed such that the channel widthwise direction thereof coincides with the <011> direction as described above, the directions (perpendicular to the plane of the figure) in which facet 8 and the gate electrodes extend are parallel to each other. Consequently, a shallow junction of a fixed depth is formed uniformly in the channel width-wise direction. It is to be noted that a substantially similar effect to that described above is obtained if the direction of the channel width of the gate electrode is in the proximity of the <011> direction.

The structure, wherein the side face of the elevated source and drain is formed fully in a facet as described above, cannot be adopted by the conventional method wherein doping of an impurity is performed by ion implantation. This is because, if the elevation height is zero near the gate as shown in FIGS. 4(b) and 4(c), the depth of the source and drain formed by ion implantation cannot be reduced in the vicinity of the gate. Thereafter, annealing is performed so that the boron contained in elevated source and drain 7 is diffused into silicon substrate 1 to form source and drain junction surface 9 in the inside of the substrate. This annealing is performed to such a degree that source and drain junction surface 9 reaches just below gate electrode 4 (FIG. 4(c)). Accordingly, the depth of the junction can be suppressed to a degree equal to the thickness of sidewall insulator 6.

It is to be noted that, if the last-mentioned annealing is omitted, then a MOSFET having a junction depth close to the ideal junction depth of zero can be realized. However, in order to make it possible to suppress a decrease of the driving capacity, which arises from the fact that the source and the drain are spaced away from the gate electrode by a distance equal to the thickness of sidewall insulator 6, sidewall insulator 6 must be formed sufficiently thin (to a thickness substantially equal to the thickness of the gate insulator).

The MISFET, formed by the process described above and having an elevation structure of the source and drain region, is characterized in that entire elevated source and drain 7 is doped in the p-type and a face of elevated source and drain 7 opposing the side wall of the gate electrode forms an inclined face which is spaced away from the gate electrode by an increasing distance in the upward direction. Consequently, the increase in the parasitic capacitance between the gate electrode and the source and drain region, compared with that without the elevation, is reduced to a negligible level and the source and drain region obtained is shallow and low in resistance.

While formation of the p-channel transistor is described above, an n-channel transistor can also be formed in a similar manner as in the present embodiment by employing, in place of boron, phosphor, arsenic or antimony having an opposite conductivity type to that of boron.

Figure 5:
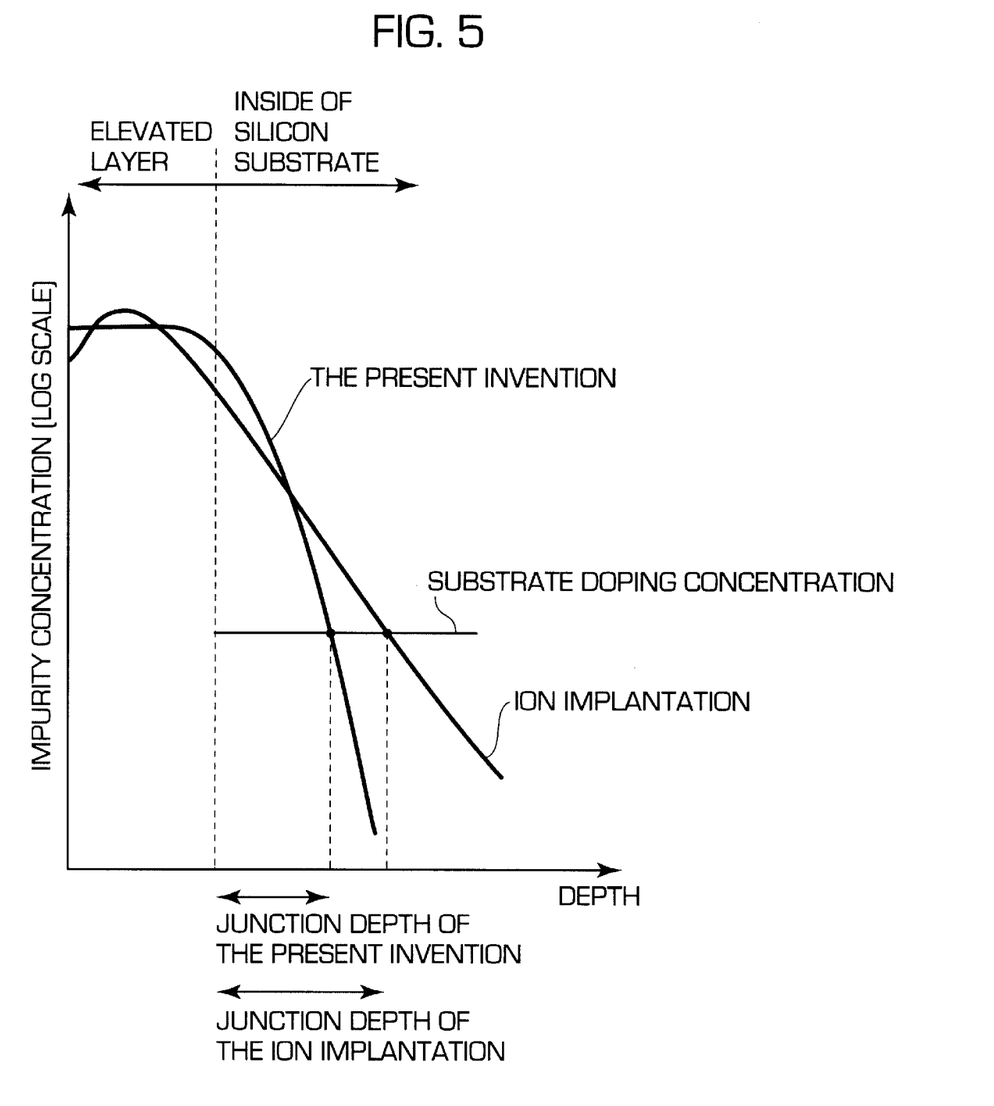
FIG. 5 is an impurity profile diagram of a diffusion layer illustrating an effect of the present invention.
Figure 6A:
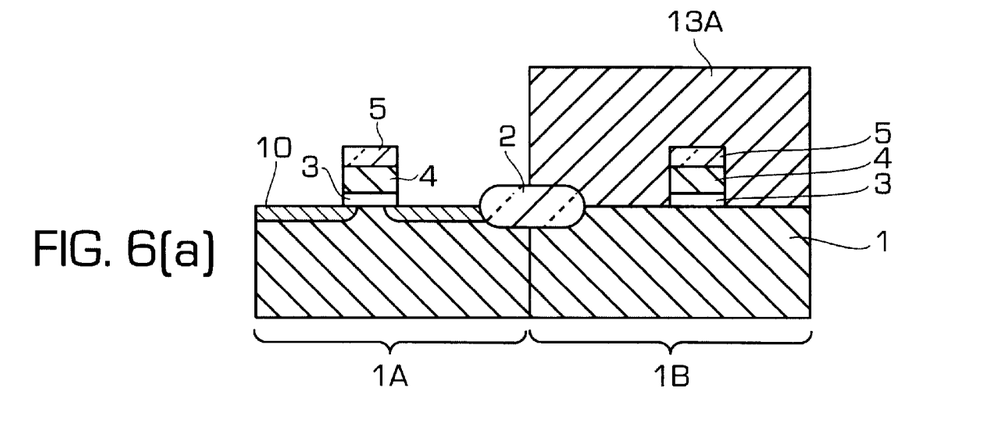
FIGS. 6(a) to 6(c) and FIGS. 7(a) and 7(b) are sectional views illustrating successive steps of a second embodiment of the present invention.
Figure 6B:
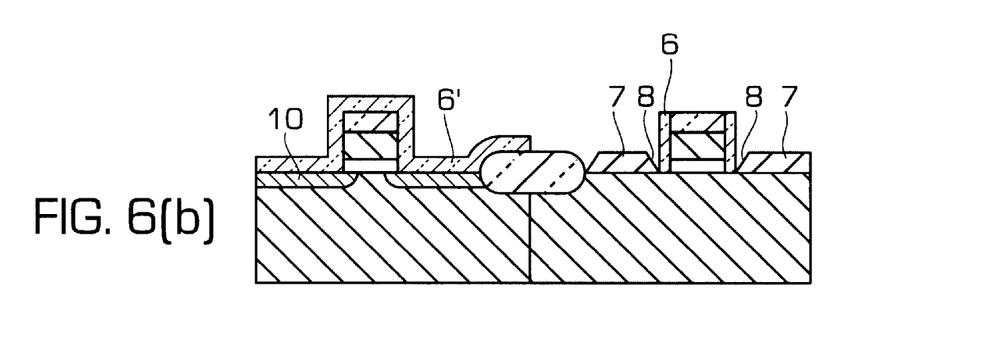
Figure 6C:
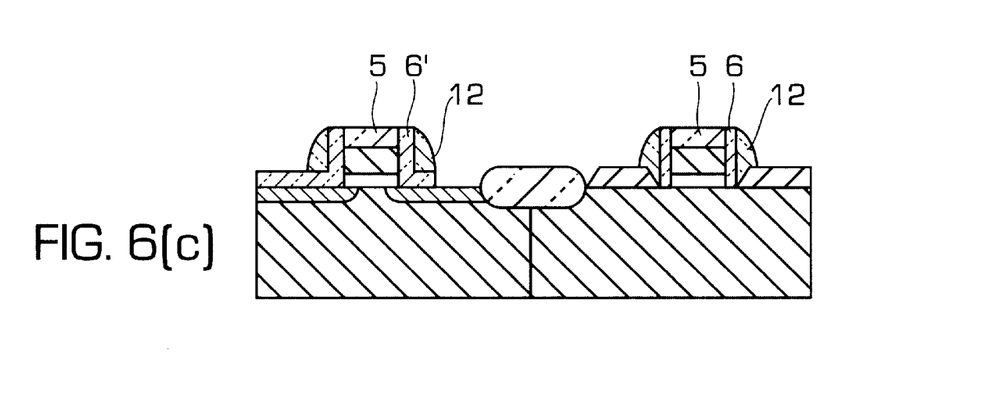
Figure 7A:
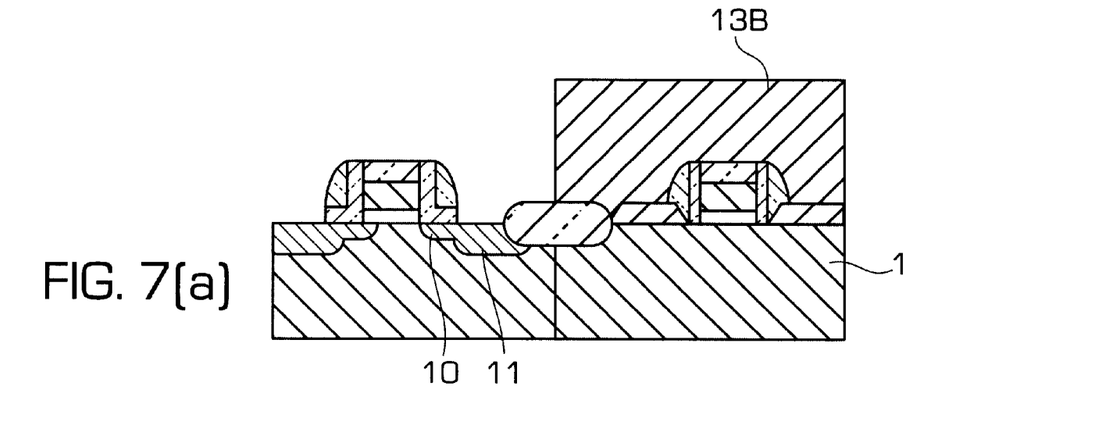
Figure 7B:
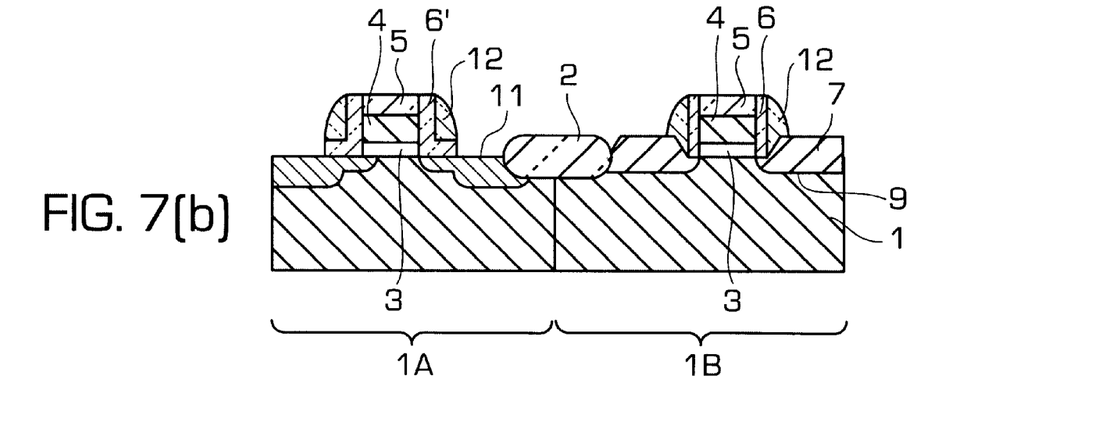
Figure 8A:
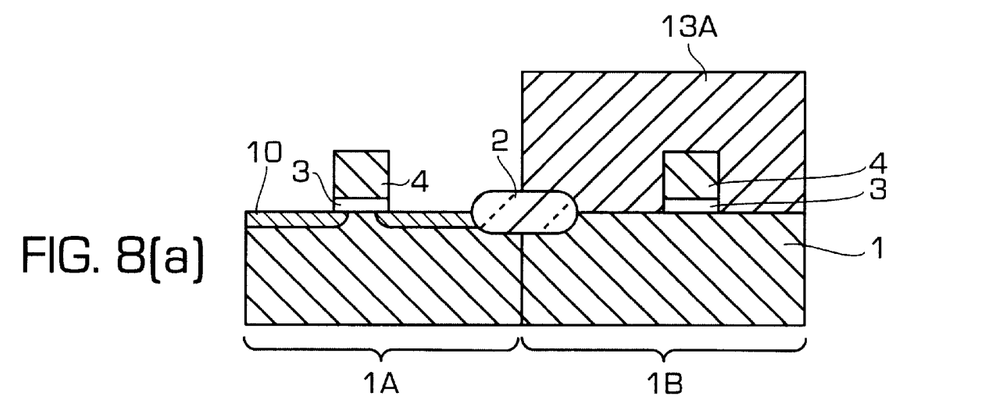
FIGS. 8(a) to 8(c) and FIGS. 9(a) to 9(c) are sectional views illustrating successive steps of a third embodiment of the present invention.
Figure 8B:
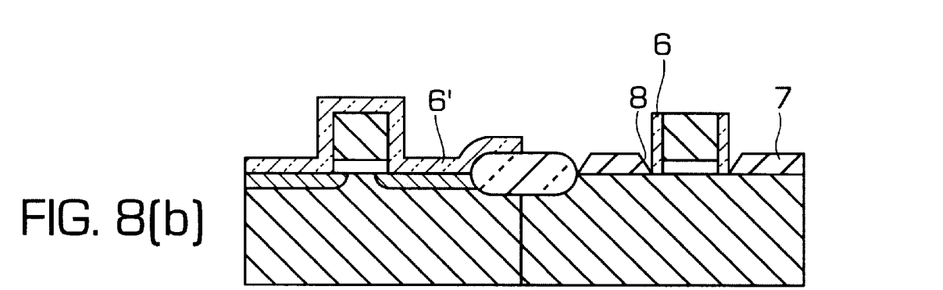
Figure 8C:
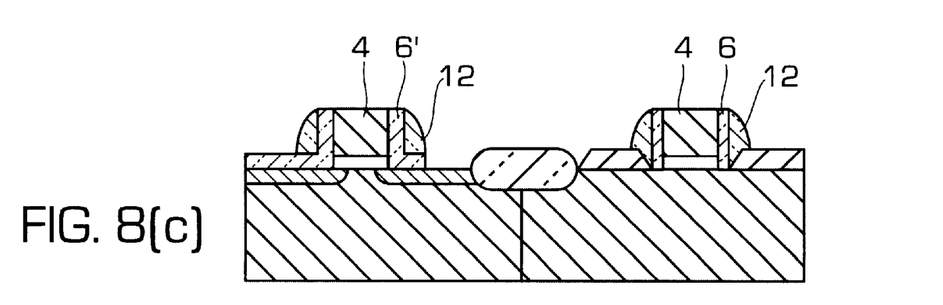

FIG. 5 is a concept diagram illustrating an effect of solid phase diffusion from such an elevated source and drain formed by selective growth as in the present invention. In FIG. 5, an effect where the impurity is boron is illustrated. The impurity profile, for solid phase diffusion from an elevated source and drain which has a staircase-like steep impurity profile (indicated in the method of the present invention), exhibits a greater inclination at the end of the profile than for the end of an impurity profile obtained where ion implantation, which is liable to cause channeling, is employed. In other words, constant C described hereinabove has a greater value. Consequently, the junction depth (depth at which the concentration of the substrate and the concentration of the impurity in the source and drain diffusion layer are equal to each other) is formed shallower with the method of the present invention than with a method employing ion implantation. Further, the amount of the impurity in the inside and on the surface of the semiconductor substrate is greater with the method of the present invention, and the resistance in the inside of the substrate is reduced to one half or less.

The effects described above are also achieved similarly where the impurity is phosphor or arsenic. However, where those impurities are employed, the differences between the effects achieved by the method of the present invention and the method employing ion implantation are smaller than those where the impurity is boron.

The second embodiment will be described below with reference to FIGS. 6(a) to 7(b). In the second embodiment of the present invention, since a method of doping an elevated source and drain with an impurity in advance is used, some contrivance is required for formation of a complementary MISFET wherein an n-channel transistor and a p-channel transistor are formed on the same substrate. The present embodiment provides one of the devices of such contrived construction. In the present embodiment, a structure having a shallow portion and a deep portion as a source and drain diffusion layer of the n-channel transistor is formed by ordinary ion implantation. Similar to the first embodiment, isolation 2, gate insulators 3, gate electrodes 4 and cap insulators 5 are first formed on silicon substrate 1 by an ordinary method, and then p-channel transistor 1B for ion implantation is covered with resist mask 13A for ion implantation and ions of an n-type impurity such as arsenic or phosphor are implanted to form low concentration diffusion layer 10 of the n-channel transistor (FIG. 6(a)). Then, resist mask 13A for ion implantation is removed and a silicon oxide film is deposited on the overall area. Then, only n-channel transistor 1A is covered with a resist mask, and the silicon oxide film is etched back only on p-channel transistor 1B. Consequently, insulator 6', which covers the entire n-channel transistor 1A, and thin sidewall insulator 6, which covers the side face of the gate electrode of p-channel transistor 1B, are formed. Thereafter, elevated source and drain 7 doped with boron is grown in a similar manner as in the first embodiment on the surface of the silicon substrate of p-channel transistor 1B at which the substrate is exposed (FIG. 6(b)). Then, a thick silicon oxide film is deposited on the overall area and then etched back so that thick sidewall insulator 12 is formed for both of the n-channel transistor and the p-channel transistor (FIG. 6(c)). Thereafter, p-channel transistor 1B is covered with resist mask 13B for ion implantation and ions of an n-type impurity are implanted again to form deep source and drain diffusion layer 11 for the n-channel transistor (FIG. 7(a)). Then, resist mask 13B for ion implantation is removed, and annealing is performed to activate the impurity implanted by ion implantation to diffuse the boron from elevated source and drain 7 of p-channel transistor 1B into the substrate. P-type source and drain junction surface 9 is formed in the inside of the substrate in this manner (FIG. 7(b)).

A complementary MISFET is formed in such a manner as described above. Here, the source and drain of the n-channel transistor is formed from a diffusion layer of a so-called LDD structure, which is formed from shallow portion 10 and deep portion 11, and the present invention is applied to the source and drain region of the p-channel transistor. It is to be noted that, for an LDD structure employed in an n-channel device, when making a source and drain of a single depth, the steps of FIGS. 6(c) to 7(a) may be omitted. Further, a deep source and drain similar to that of the n-channel device may be applied also to the p-channel device.

In the first and second embodiments, the top face of gate electrode 4 is covered with cap insulator 5. Cap insulator 5 is effective to prevent occurrence of the selective growth on the gate electrode. However, the selectivity in growth is sometimes present between gate electrode 4 and silicon substrate 1 and the growth on gate electrode 4 may possibly be prevented even if gate electrode 4 is not covered with an insulator. Further, sometimes it is not required to positively prevent the growth on the gate electrode. In this instance, cap insulator 5 may be omitted. In a complementary and using refined silicon MISFET having the gate length of less than 0.4 μm, a dual gate structure is normally used, wherein an n-type polysilicon is used for the gate electrode of an n-channel transistor and a p-type polysilicon is used for the gate electrode of the p-channel transistor. The advantage of omitting cap insulator 5 is that a dual gate structure can be realized by a short process by doping, upon formation of a deep source and drain diffusion layer by ion implantation, the same impurity at one time into the two gate electrodes.

Next, the third embodiment of the present invention will be described with reference to FIGS. 8(a) to 8(c) and 9(a) to 9(c). The figures are sectional views illustrating successive steps of the method of the third embodiment where it is applied to production of a complementary MISFET of the dual gate type. Similar to the second embodiment, isolation 2, gate insulators 3 and gate electrodes 4 are first formed on the surface of silicon substrate 1, and then p-channel transistor 1B is covered with resist mask 13A for ion implantation and ions of arsenic are implanted into n-channel transistor 1A. Low concentration diffusion layer 10 is formed in this manner. Here, gate electrode 4 is formed from a layer of a polysilicon which does not contain any impurity or from a polysilicon and another low resistance material (metal or metal silicide) layered such that the polysilicon is positioned as the bottom layer. Then, in the present method of production, n-channel transistor 1A is covered with thin insulator 6' and thin sidewall insulator 6 is formed on a side wall of the gate electrode of the p-channel transistor. Thereafter, in the method of production, selective growth of a silicon thin film is performed to form elevated source and drain 7 from a silicon single crystal thin film (FIG. 8(b)). The thickness of the silicon single crystal thin film in this instance is approximately 50 nm. Here, where the gate electrode is formed from a polysilicon, a film of a polysilicon of approximately 50 nm thick containing a boron impurity is deposited on the upper part of the gate electrode. Where an upper portion of gate electrode 4 is formed from a metal silicide such as tungsten silicide, a silicon thin film is not formed on the gate electrode. Thereafter, thick sidewall insulator 12 is formed on sidewalls of gate electrode 4 of the n-channel transistor and gate electrode 4 of the p-channel transistor (FIG. 8(c)).

Figure 9A:
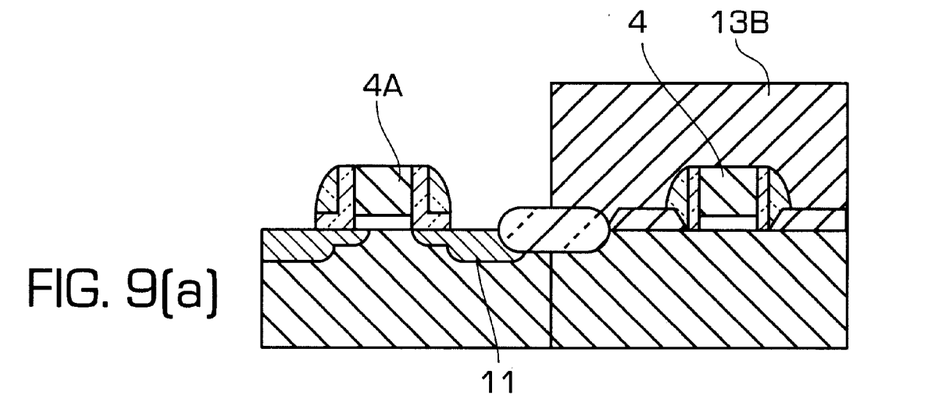
Figure 9B:
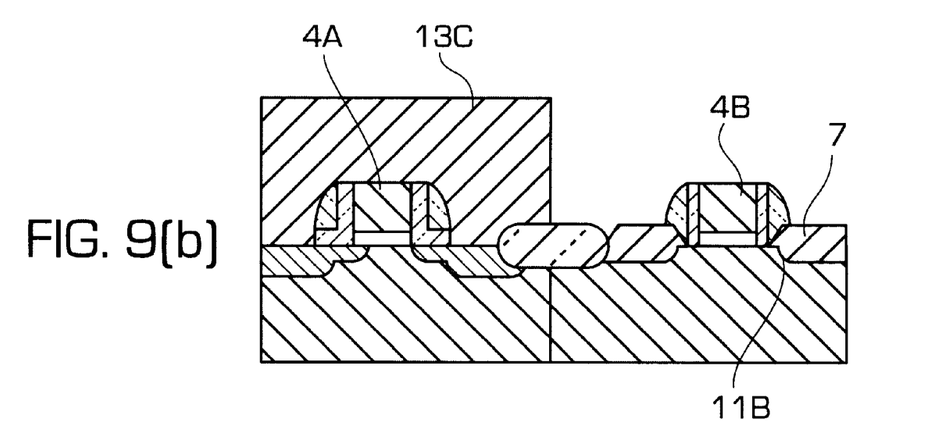
Figure 9C:
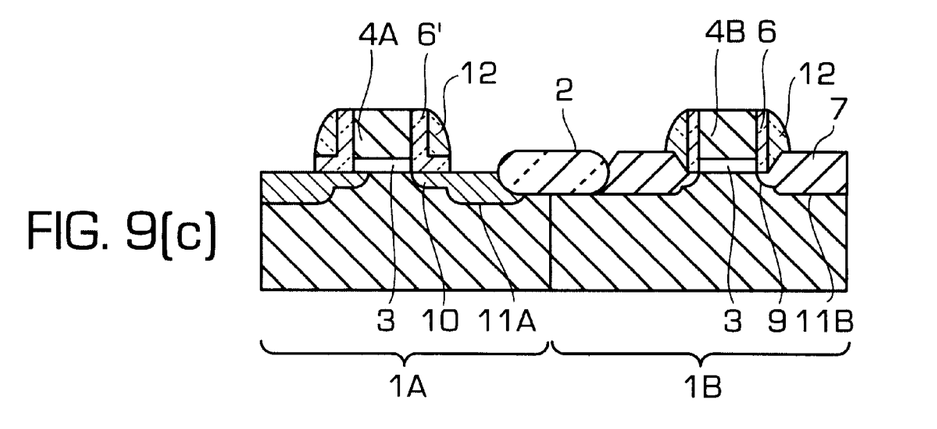

Then, p-channel transistor 1B is covered with resist mask 13B for ion implantation and high concentration arsenic ion implantation is performed into n-channel transistor 1A to form source and drain diffusion layer 11 (FIG. 9(a)). At the same time, only the gate polysilicon of the exposed n-channel transistor is doped with arsenic, and this electrode becomes n-type gate electrode 4A. Then, only the n-channel transistor area is covered with resist mask 13C, and ions of a p-type impurity such as boron are implanted into the p-channel transistor area to form deep source and drain junction surface 11B of the p-channel transistor while the gate electrode of the p-channel transistor is simultaneously converted into p-type gate electrode 4B (FIG. 9(b)). Finally, annealing is performed to activate the impurity implanted by ion implantation and to diffuse the boron from elevated source and drain 7 of the p-channel transistor into the substrate to form shallow source and drain junction surface 9 in the inside of the substrate (FIG. 9(c)). An MISFET to which the present invention is applied is formed in this manner.

Next, the fourth embodiment of the present invention will be described with reference to FIGS. 10(a) to 10(d). FIGS. 10(a) to 10(d) illustrate a method of producing a complementary MISFET wherein both of an n-channel transistor and a p-channel transistor have a source and drain region having an elevated source and drain. In the following description, any element to which no particular description is given is similar to that described hereinabove with reference to FIGS. 8(a) to 9(c).

Figure 10A:
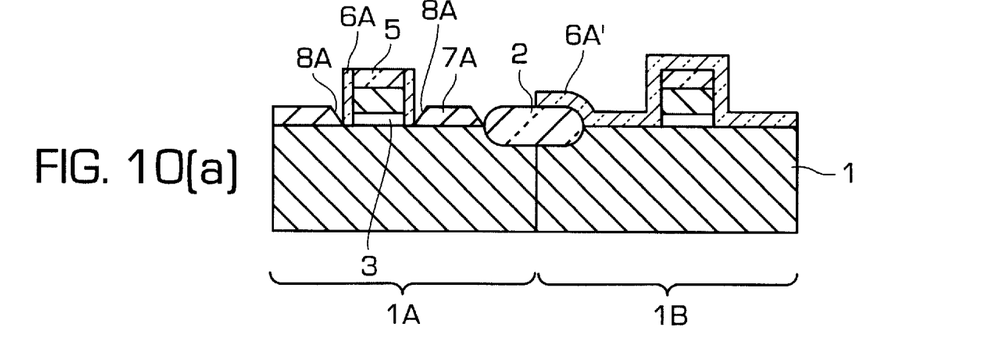
FIGS. 10(a) to 10(d) are sectional views illustrating successive steps of a fourth embodiment of the present invention.
Figure 10B:
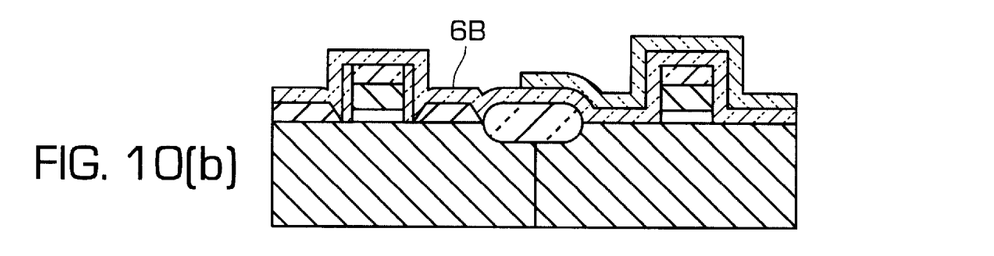
Figure 10C:
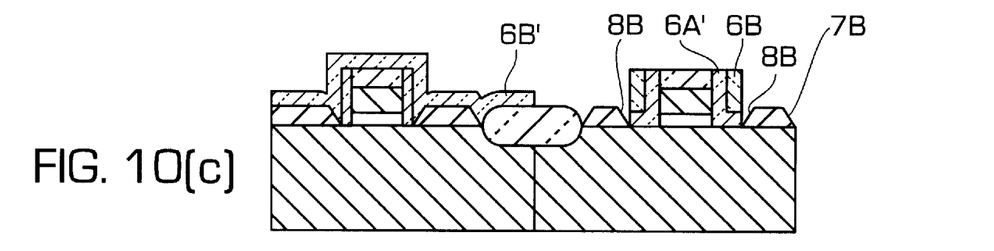
Figure 10D:
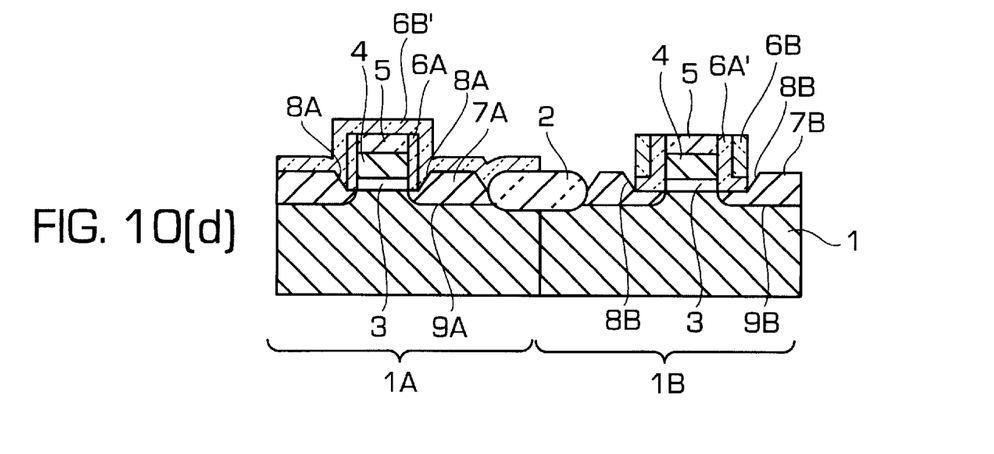

According to the method of production of the present embodiment, entire p-channel transistor 1B is covered with thin insulator 6A', and a silicon single crystal thin film doped with arsenic or phosphor is selectively grown only in a region where a source and drain region of the n-channel transistors is for forming n-type elevated source and drain 7A. Facet 8A is formed by the process (FIG. 10(a)). Then, as shown in FIG. 10(b), in the process of production, thin insulator 6B is deposited on the entire area, and anisotropic dry etching is performed only for the thin insulator of p-channel transistor 1B to expose the surface of the silicon substrate. Then, a silicon single crystal thin film doped with boron is selectively grown on the exposed surface of the silicon substrate to form p-type elevated source and drain 7B. Also at this time, facet 8B is formed (FIG. 10(c)). Then, annealing is performed to diffuse the impurity from elevated source and drain 7B into silicon substrate 1 to form n-type source and drain junction surface 9A in the inside of the substrate and p-type source and drain junction surface 9B in the inside of silicon substrate 1 (FIG. 10(d)). A complementary MISFET, wherein the present invention is applied to the source and drain regions of the n-channel transistor and the p-channel transistor, is formed in this manner.

Figure 11A:
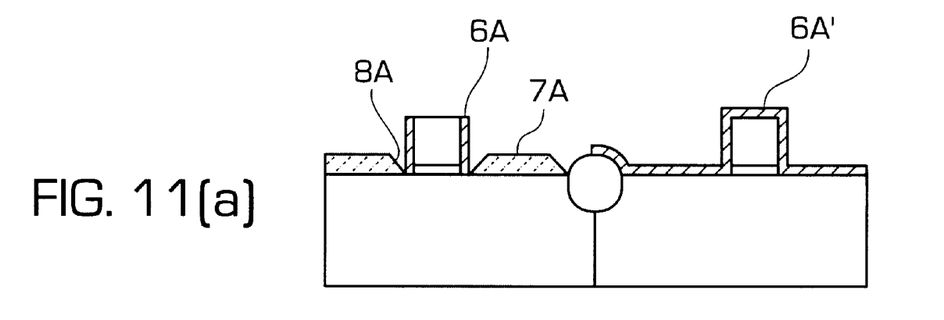
FIGS. 11(a) to 11(c) are sectional views illustrating successive steps of a fifth embodiment of the present invention.

In the fourth embodiment described above, at the elevation step of the p-type device, the gate sidewall is formed from layers of the first sidewall insulator 6A and the second sidewall insulator 6B. Consequently, the thickness of the sidewall becomes thicker than that of the n-type device, and the n-type device and the p-type device cannot be formed such that the sidewalls thereof have thicknesses independent of each other. The fifth embodiment of the present invention which is improved in this regard will be described with reference to FIGS. 11(a) to 11(c).

Figure 11B:
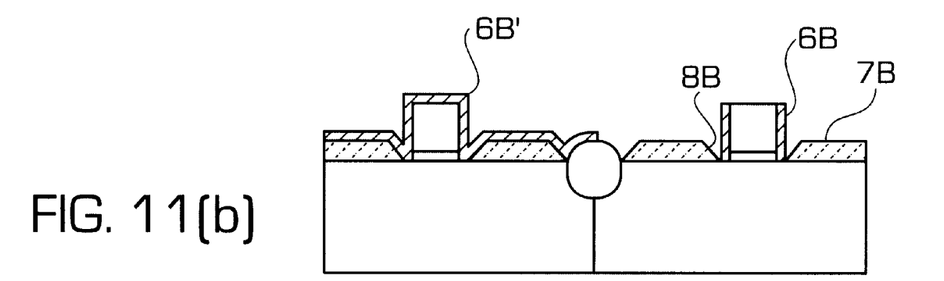
Figure 11C:
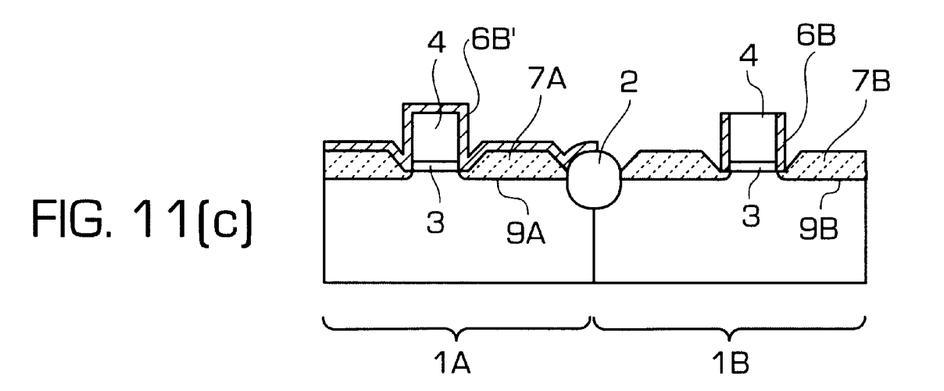

According to the method of production of the present embodiment, a side face of the gate of n-channel transistor 1A and entire p-channel transistor 1B are covered with first insulators 6A and 6A', respectively. Here, for first insulators 6A and 6A', a material which can be selectively removed by etching apart from any of a silicon substrate, a gate insulator, and a gate material are used. Here, first insulators 6A and 6A' are formed from silicon nitride films. In the method of production, a silicon single crystal thin film doped with arsenic or phosphor is selectively grown in an area which is for making the source and drain region of the n-channel transistor to form n-type elevated source and drain 7A. By this process, facet 8A is formed on elevated source and drain 7A (FIG. 11(a)). Thereafter, silicon nitride films 6A and 6A' are selectively removed using phosphoric acid. Then, as shown in FIG. 11(b), second insulators 6B' and 6B, which cover the entire n-channel transistor 1A and a side face of the gate of the p-channel transistor, are formed, and a silicon single crystal thin film doped with boron is selectively grown only in a region which is for making the source and drain region of the p-channel transistor to form p-type elevated source and drain 7B. By this process, facet 8B is formed (FIG. 11(b)). Then, annealing is performed to diffuse the impurity from the elevated source and drain into silicon substrate 1 to form n-type source and drain junction surface 9A and p-type source and drain junction surface 9B in the inside of the substrate (FIG. 11(c)). A complementary MISFET, wherein the present invention is applied to the source and drain regions of the n-channel transistor and the p-channel transistor, is formed in this manner. Since insulators 6B and 6B' are formed after insulators 6A and 6A' are removed, the n-channel transistor and the p-channel transistor are formed with gate sidewall films of independent thicknesses. It is to be noted that the sequential order of formation of the n-channel transistor and the p-channel transistor may be reversed.

In the embodiments described above, it is described that an MISFET is formed on a silicon semiconductor substrate. However, the application of the present invention is not limited to the specific substrate. For example, a similar effect is presented also where an MISFET is formed on the surface of an SOI (Silicon on Insulator). The advantage in this instance resides in that, upon formation of a source and drain of a transistor, destruction of crystal by ion implantation does not occur and a diffusion layer of a good quality can be formed also on an SOI substrate. When a source and drain diffusion layer is formed by ordinary ion implantation, recovery of destroyed crystal is particularly difficult with an SOI substrate. In contrast, with the method of the present invention, the crystal quality of an impurity diffusion layer is kept good, and the problem of recovery of the crystal quality can be eliminated.

Further, the effects of the present invention are not lost even if a metal thin film of titanium silicide or the like is formed on the surface of an elevated source and drain of a source and drain region.

As described above, according to the MISFET and the method of production of the same of the present invention, upon selective growth of a silicon single crystal thin film used for an elevated source and drain of a source and drain region, doping of an impurity is performed during the growth, and then, the impurity is diffused by solid phase diffusion into the silicon substrate to form a source and drain junction surface on the principal plane of the silicon substrate. By this production method, a very shallow junction free from a dispersion in junction depth is realized. Further, according to the present invention, since the impurity profile in the inside of the silicon substrate can be made steep and the elevated source and drain can be positioned in the proximity of the gate electrode, an increase of the parasitic resistance caused by making the junction shallow, which occurs in the prior arts, is prevented. Furthermore, according to the present invention, since ion implantation is not used in formation of a shallow junction, the side face of the elevated source and drain which opposes the gate electrode can be formed fully in a facet, and the parasitic capacitance produced between the gate electrode and the source and drain region is reduced remarkably. In addition, according to the present invention, a complementary MISFET having the advantages described above is realized readily by keeping, upon formation of an elevated source and drain of one conductivity type by selective growth, a device of the other conductivity type covered with an insulator.

What is claimed is:

1. A method of producing an MISFET, said method comprising:

forming a gate electrode on a gate insulator on a principal plane of a semiconductor substrate;

forming a first insulator on a sidewall face of said gate electrode;

selectively forming a uniformly doped semiconductor thin film layer containing an impurity of one conductivity type in a region of said principal plane of said semiconductor substrate for subsequent use in forming a source and drain diffusion layer; and forming a facet at an end portion of said semiconductor thin film next to said first insulator on said sidewall face of said gate electrode, said facet having an inclination angle between said sidewall face of said gate electrode and said principal plane of said semiconductor substrate.

2. A method of producing a complementary MISFET device comprising both n-type and p-type MISFETS, said method comprising:

forming a gate electrode on a gate insulator on a principal plane of a semiconductor substrate;

forming a first insulator on a sidewall face of said gate electrode;

selectively forming a uniformly doped first semiconductor thin film layer containing an impurity of one conductivity type in a region of said principal plane of said semiconductor substrate for subsequent use in forming a source and drain diffusion layer; and forming a facet at an end portion of said first semiconductor thin film next to said first insulator on said sidewall face of said gate electrode, said facet having an inclination angle between said sidewall face of said gate electrode and said principal plane of said semiconductor substrate, thereby forming said complementary MISFET.

3. A method of producing an MISFET as claimed in claim 1, further comprising the step of diffusing the impurity of the one conductivity type from said semiconductor thin film layer into said semiconductor substrate by thermal diffusion.

4. A method of producing a complementary MISFET device as claimed in claim 2, further comprising a the step of diffusing the impurity of the one conductivity type from said first semiconductor thin film layer into said semiconductor substrate by thermal diffusion.

5. A method of producing an MISFET as claimed in claim 1, further comprising the steps of:

forming a second insulator covering said first insulator formed on said sidewall face of said gate electrode; and implanting ions of an impurity of the one conductivity type into or through said semiconductor thin film layer to dope the impurity of the one conductivity type into said source and drain diffusion layer and to dope the impurity into said gate electrode.

6. A method of producing a complementary MISFET device as claimed in claim 2, further comprising the steps of:

forming a second insulator covering said first insulator formed on said sidewall face of said gate electrode; and implanting ions of an impurity of the one conductivity type into or through said first semiconductor thin film layer to dope the impurity of the one conductivity type into said source and drain diffusion layer and to dope the impurity into said gate electrode.

7. A method of producing a complementary MISFET device as claimed in claim 2, further comprising, after said gate insulator and said gate electrode of said complementary MISFET device are formed on said semiconductor substrate, the steps of:

covering an entire area of said semiconductor substrate with a second insulator; and performing anisotropic dry etching of said second insulator leaving said second insulator in a region in which the MISFETs of one of the conductivity types are to be formed and on said sidewall face of said gate electrode of the MISFETs of the other conductivity type.

8. A method of producing a complementary MISFET device as claimed in claim 7, further comprising, after performing anisotropic dry etching, the step of selectively growing a second semiconductor thin film layer and then selectively removing said third insulator.

9. A method of producing an MISFET as claimed in claim 1, wherein said semiconductor thin film layer is a thin film of silicon single crystal, germanium single crystal or mixed crystal of silicon and germanium, and said principal plane of said semiconductor substrate is a $\{100\}$ plane; said facet is a $\{311\}$ plane or a $\{111\}$ plane; and a channel widthwise direction of said gate electrode is a $<011>$ direction.

10. A method of producing a complementary MISFET device as claimed in claim 2, wherein said first semiconductor thin film layer is a thin film of silicon single crystal, germanium single crystal or mixed crystal of silicon and germanium, and said principal plane of said semiconductor substrate is a $\{100\}$ plane; said facet is a $\{311\}$ plane or a $\{111\}$ plane; and a channel widthwise direction of said gate electrode is a $<011>$ direction.

11. A method of producing an MISFET as claimed in claim 9, further comprising the step of diffusing the impurity of the one conductivity type from said semiconductor thin film layer into said semiconductor substrate by thermal diffusion.

12. A method of producing a complementary MISFET device as claimed in claim 10, further comprising the step of diffusing the impurity of the one conductivity type from said first semiconductor thin film layer into said semiconductor substrate by thermal diffusion.

13. A method of producing an MISFET as claimed in claim 9, further comprising the steps of:

forming a second insulator covering said first insulator formed on said sidewall face of said gate electrode;

implanting ions of an impurity of the one conductivity type into or through said semiconductor thin film layer to dope the impurity of the one conductivity type into the semiconductor substrate to form said source and drain diffusion layer and dope the impurity also into said gate electrode.

14. A method of producing an MISFET as claimed in claim 11, further comprising the steps of:

forming a second insulator covering said first insulator formed on said sidewall face of said gate electrode; and implanting ions of an impurity of the one conductivity type into or through said semiconductor thin film layer to dope the impurity of the one conductivity type into the semiconductor substrate to form said source and drain diffusion layer and dope the impurity also into said gate electrode.

15. A method of producing an MISFET as claimed in claim 3, further comprising the steps of:

forming a second insulator covering said first insulator formed on said sidewall face of said gate electrode; and implanting ions of an impurity of the one conductivity type into or through said semiconductor thin film layer to dope the impurity of the one conductivity type into said source and drain diffusion layer and to dope the impurity into said gate electrode.

16. A method of producing a complementary MISFET device as claimed in claim 4, further comprising the steps of:

forming a second insulator covering said first insulator formed on said sidewall face of said gate electrode; and implanting ions of an impurity of the one conductivity type into or through first said semiconductor thin film layer to dope the impurity of the one conductivity type into said source and drain diffusion layer and to dope the impurity into said gate electrode.

17. A method of producing a complementary MISFET device as claimed in claim 12, further comprising the steps of:

forming a second insulator covering said first insulator formed on said sidewall face of said gate electrode; and implanting ions of an impurity of the one conductivity type into or through said first semiconductor thin film layer to dope the impurity of the one conductivity type into the semiconductor substrate to form said source and drain diffusion layer and dope the impurity also into said gate electrode.

18. A method of producing an MISFET as claimed in claim 10, further comprising the steps of:

covering an entire area of said semiconductor substrate with a second insulator; and performing anisotropic dry etching of said second insulator leaving said second insulator in a region in which the MISFETs of one of the conductivity types are to be formed and on said sidewall face of said gate electrode of the MISFETs of the other conductivity type.

19. A method of producing a complementary MISFET device as claimed in claim 18, further comprising after performing the anisotropic dry etching, the step of selectively growing a second semiconductor thin film layer and then selectively removing said third insulator.

20. A method of producing a complementary MISFET device as claimed in claim 10 further comprising the steps of:

forming a second insulator covering said first insulator formed on said sidewall face of said gate electrode; and implanting ions of an impurity of the one conductivity type into or through said semiconductor thin film layer to dope the impurity of the one conductivity type into the source and drain and dope the impurity also into said gate electrode.

* * * * *